United States Patent
Chang et al.

(10) Patent No.: US 11,948,835 B2
(45) Date of Patent: Apr. 2, 2024

(54) INTERCONNECTION STRUCTURE WITH ANTI-ADHESION LAYER

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 428 days.

(21) Appl. No.: 17/230,701

(22) Filed: Apr. 14, 2021

(65) Prior Publication Data

US 2021/0233806 A1 Jul. 29, 2021

Related U.S. Application Data

(60) Continuation of application No. 16/206,768, filed on Nov. 30, 2018, now Pat. No. 10,998,226, which is a division of application No. 14/984,568, filed on Dec. 30, 2015, now Pat. No. 10,985,055.

(51) Int. Cl.
*H01L 21/768* (2006.01)
*H01L 23/485* (2006.01)
*H01L 23/528* (2006.01)

(52) U.S. Cl.
CPC .... *H01L 21/76831* (2013.01); *H01L 21/7681* (2013.01); *H01L 21/76811* (2013.01); *H01L 21/76813* (2013.01); *H01L 21/76877* (2013.01); *H01L 23/528* (2013.01); *H01L 21/76804* (2013.01); *H01L 23/485* (2013.01)

(58) Field of Classification Search
CPC .......................................... H01L 21/768–76807
See application file for complete search history.

(56) References Cited

U.S. PATENT DOCUMENTS

| | | | |
|---|---|---|---|
| 5,604,156 A | 2/1997 | Chung et al. | |
| 5,622,883 A * | 4/1997 | Kim | H01L 21/76804 |
| | | | 257/E21.578 |
| 5,904,565 A | 5/1999 | Nguyen et al. | |
| 6,448,176 B1 | 9/2002 | Grill et al. | |
| 6,904,565 B1 | 6/2005 | Lentz | |
| 6,962,869 B1 | 11/2005 | Bao et al. | |
| 8,138,082 B2 | 3/2012 | Torres et al. | |
| 8,952,547 B2 | 2/2015 | Liaw | |

(Continued)

FOREIGN PATENT DOCUMENTS

CN 101345240 A 1/2009
TW 382798 B 2/2000

*Primary Examiner* — Didarul A Mazumder
*Assistant Examiner* — Gustavo G Ramallo
(74) *Attorney, Agent, or Firm* — Maschoff Brennan

(57) ABSTRACT

A device comprises a first metal structure, a dielectric structure, a dielectric residue, and a second metal structure. The dielectric structure is over the first metal structure. The dielectric structure has a stepped sidewall structure. The stepped sidewall structure comprises a lower sidewall and an upper sidewall laterally set back from the lower sidewall. The dielectric residue is embedded in a recessed region in the lower sidewall of the stepped sidewall structure of the dielectric structure. The second metal structure extends through the dielectric structure to the first metal structure.

20 Claims, 4 Drawing Sheets

(56) References Cited

U.S. PATENT DOCUMENTS

| | | |
|---|---|---|
| 2002/0155708 A1 | 10/2002 | Lo et al. |
| 2004/0222529 A1* | 11/2004 | Dostalik ........... H01L 21/76831 257/E23.145 |
| 2006/0170106 A1 | 8/2006 | Tseng et al. |
| 2006/0183348 A1 | 8/2006 | Meagley et al. |
| 2008/0079155 A1 | 4/2008 | Mule et al. |
| 2008/0093743 A1 | 4/2008 | Yang et al. |
| 2008/0258228 A1 | 10/2008 | Chuang et al. |
| 2009/0057907 A1 | 3/2009 | Yang et al. |
| 2011/0291284 A1 | 12/2011 | Goldfarb et al. |
| 2012/0104622 A1 | 5/2012 | Kim et al. |
| 2013/0009323 A1 | 1/2013 | Lin et al. |
| 2014/0035142 A1* | 2/2014 | Yang ................ H01L 23/53295 438/653 |
| 2014/0103402 A1* | 4/2014 | Hung ................ H01L 21/76816 438/630 |
| 2014/0319600 A1 | 10/2014 | Kothandaraman et al. |
| 2015/0170966 A1 | 6/2015 | Tung |
| 2015/0200260 A1 | 7/2015 | Yu et al. |
| 2015/0236131 A1 | 8/2015 | Chang et al. |
| 2016/0379925 A1 | 12/2016 | Ok et al. |
| 2017/0005037 A1 | 1/2017 | Liang et al. |

\* cited by examiner

INTERCONNECTION STRUCTURE WITH ANTI-ADHESION LAYER

PRIORITY CLAIM AND CROSS-REFERENCE

The present application is continuation application of U.S. application Ser. No. 16/206,768, filed Nov. 30, 2018, which is a divisional application of U.S. application Ser. No. 14/984,568, filed Dec. 30, 2015, now U.S. Pat. No. 10,985,055, issued Apr. 20, 2021, all of which are herein incorporated by reference in their entireties.

BACKGROUND

A dual damascene process is a technique for forming interconnections in semiconductor devices. As the feature sizes get smaller, the dual damascene process provides a more exact dimensional control over small geometries. Therefore, the dual damascene process is suited for ultra large scale integrated (ULSI) circuit technology where more and more devices are being packed into the same or smaller areas in a semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
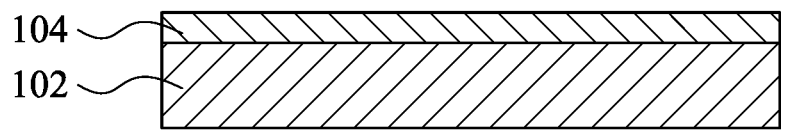
FIGS. 1 to 8 are cross-sectional views of a method for manufacturing an interconnection structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 to 8 are cross-sectional views of a method for manufacturing an interconnection structure at various stages in accordance with some embodiments of the present disclosure.

Reference is made to FIG. 1. A liner layer 104 is formed on a non-insulator structure 102. The non-insulator structure 102 refers to a structure formed of one or more non-insulator materials, polysilicon, metal, conductive materials, semiconductor materials or combinations thereof. The non-insulator structure 102 can serve as a gate electrode, a source/drain region of a semiconductor device, such as a fin field effect transistor (FinFET).

In some embodiments, when the non-insulator structure 102 serves as the gate electrode of the FinFET, the non-insulator structure 102 may be formed by a gate last process. An exemplary gate last process may include forming a dummy gate structure including a material, such as polysilicon, on a semiconductor fin, forming spacers including a material, such as silicon oxide, silicon nitride, silicon oxynitride, silicon carbide, beside the dummy gate structure, removing the dummy gate structure to form a trench between the spacers, and forming at least one metal layer into the trench between the spacers to from the non-insulator structure 102. The metal layer may include a metal material suitable for forming the gate electrode or a portion thereof, including, work function layers, liner layers, interface layers, seed layers, adhesion layers, barrier layers and so on. In some embodiments, the metal layer may include suitable metal, such as TiN, WN, TaN, or Ru, which performs in a p-type FinFET. In some alternative embodiments, the metal layer may include suitable metal, such as Ti, Ag, Al, TiAl, TiAlN, TiAlC, TiAlCN, TaC, TaCN, TaSiN, Mn, or Zr, which performs in an n-type FinFET.

In some embodiments, when the non-insulator structure 102 serves as the source/drain region, an exemplary formation process may include doping an n-type dopant, such as phosphorous, or a p-type dopant, such as boron, into at least one portion of the semiconductor fin not covered by the spacers and the gate electrode by using ion implantation. Another exemplary process of forming the source/drain region may include forming at least one source/drain recess in the fin adjacent to the spacer, forming a seed layer in the source/drain recess, forming a relaxed epitaxial layer on the seed layer in the source/drain recess, forming an epitaxial layer on the relaxed epitaxial layer in the source/drain recess, so that the seed layer, the relaxed epitaxial layer and the epitaxial layer form a source/drain stressor to serve as the source/drain region. In some embodiments, the source/drain stressor includes, for example, SiP, SiP or SiCP, which is able to induce a tensile strain to the n-type channel in the semiconductor fin. In some other embodiments, the source/drain stressor includes SiGe, which is able to induce a compressive strain to the p-type channel in the semiconductor fin.

The liner layer 104 may serve as an etch stop layer, which protects the non-insulator structure 102 during an etching process for forming a via opening and/or an etching process of forming a trench opening. In some embodiments, the liner layer 104 may include a dielectric material, such as silicon carbide, silicon nitride or carbon-doped silicon nitride. In some embodiments, the liner layer 104 may include a conductive material, such as Ti, TiN, TiC, TiCN, Ta, TaN, TaC, TaCN, W, WN, WC, WCN, TiAl, TiAlN, TiAlC, or TiAlCN. In some embodiments, the liner layer 104 may be deposited using chemical vapor deposition (CVD), high density plasma (HDP) CVD, sub-atmospheric CVD (SACVD), molecular layer deposition (MLD), sputtering, physical vapor deposition (PVD), plating, or other suitable techniques. For example, in some embodiments, the MLD process is carried out under a pressure less than about 10 mTorr and in the temperature range from about 350° C. to about 500° C. In some embodiments, the silicon nitride is deposited on the top surface of the non-insulator structure 102 by reacting a silicon source compound and a nitrogen source. The silicon source compound provides silicon to the deposited silicon nitride and may include silane ($SiH_4$) or tetrathoxysilane (TEOS). The nitrogen source provides nitrogen to the deposited silicon nitride and may include ammonia ($NH_3$) or nitrogen gas ($N_2$). In some other embodiments, the carbon-doped silicon nitride is deposited on the top surface of the non-insulator structure 102 by reacting a carbon source compound, a silicon source compound, and a nitrogen source. The carbon source compound may include an organic compound, such as a hydrocarbon compound, e.g., ethylene ($C_2H_6$).

Figure 2:
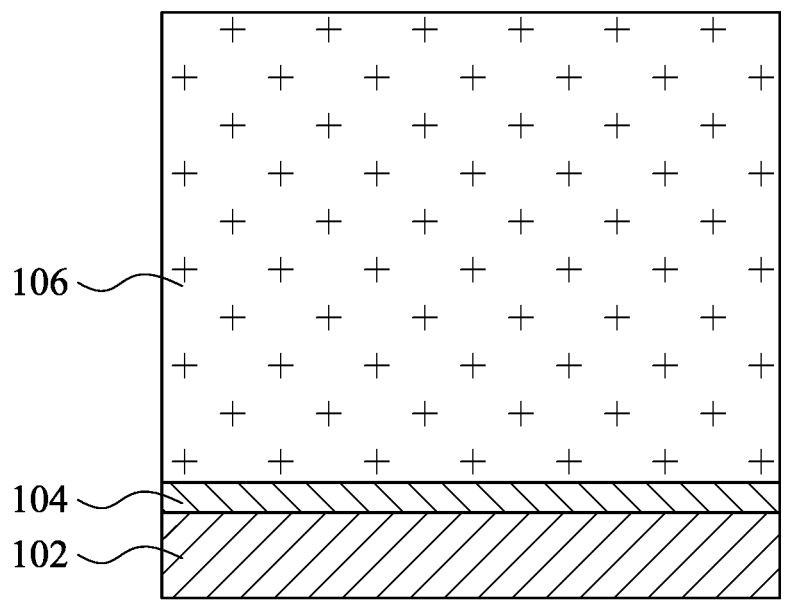

Reference is made to FIG. 2. A dielectric structure 106 is formed on the liner layer 104. In other words, the liner layer 104 is present between the dielectric structure 106 and the non-insulator structure 102. The dielectric structure 106 may be an interlayer dielectric (ILD) layer that includes a dielectric material. The dielectric material may include tetrathoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), polyimide, and/or combinations thereof. The ELK dielectric material has a dielectric constant less than, for example, about 2.5. It is understood that the dielectric structure 106 may include one or more dielectric materials and/or one or more dielectric layers. In some embodiments, the dielectric structure 106 may be deposited on the liner layer 104 by CVD, HDP CVD, SACVD, spin-on, sputtering, or other suitable techniques.

Figure 3:
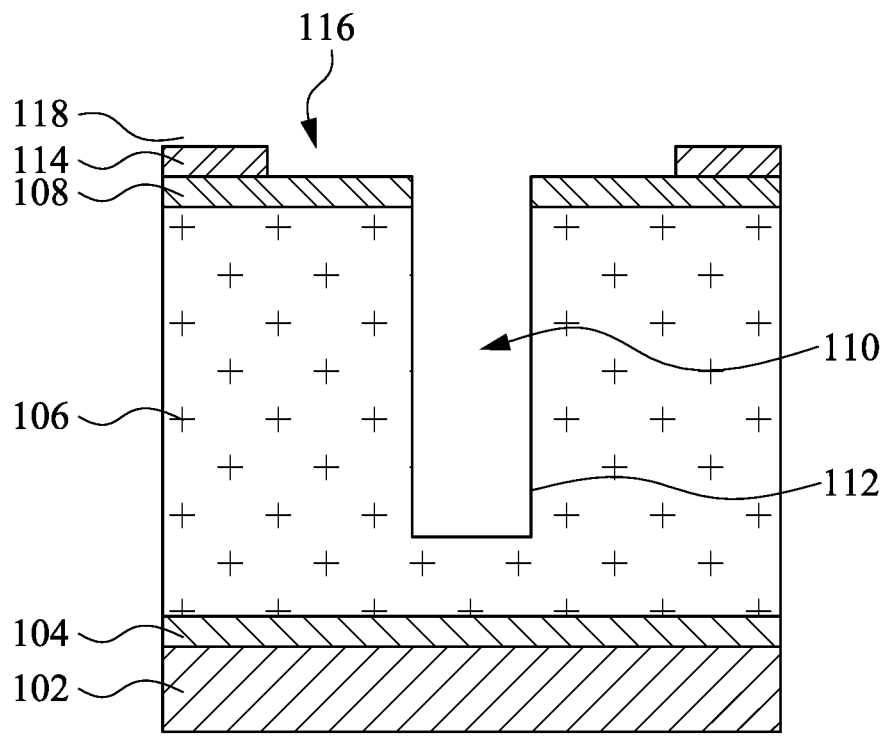

Reference is made to FIG. 3. An anti-reflection layer 108 is formed on the dielectric structure 106. The anti-reflection layer 108 may be formed of a nitride material, an organic material, an oxide material and the like. The anti-reflection layer 108 may be formed by using suitable techniques, such as CVD.

An Etching process is performed to the dielectric structure 106 to form a recess 110 therein, and the liner layer 104 is not exposed in the recess 110. In other words, the dielectric structure 106 is recessed until reaching a level above the liner layer 104. Stated differently, the etching process does not etch through the dielectric structure 106 to expose the liner layer 104. Therefore, at this step, the liner layer 104 is not etched or damaged, so that a byproduct of etching the liner layer 104 is not generated during this etching process. As such, no byproduct is adhered to an inner surface 112 of the recess 110 during the etching process. An exemplary formation process of the recess 110 is described as follows. A photoresist layer (not shown) may be formed over the dielectric structure 106 and then patterned to form a photoresist mask with the image of the recess 110. Using the photoresist layer as a mask, the pattern of the recess 110 is then etched into the dielectric structure 106. After the etching process, the photoresist mask is removed by, for example, oxygen plasma ashing. The etching process of forming the recess 110 is stopped before the liner layer 104 is exposed, so that a portion of the dielectric structure 106 remains between the recess 110 and the liner layer 104 at this step. Such a remaining portion of the dielectric structure 106 can protect the liner layer 104 from being etched or damaged, thereby preventing the byproduct of etching the liner layer 104 from adhered to the inner surface 112 of the recess 110. In some embodiments, the etching process may be a dry etching, wet etching and/or plasma etching process. For example, the etching process of forming the recess 110 may employ a mixture of tetrafluoromethane ($CF_4$), trifluoromethane ($CHF_3$) and oxygen as the etching gases.

A mask layer 114 may be formed on the anti-reflection layer 108. The mask layer 114 has an opening 116. The opening 116 exposes a portion of the anti-reflection layer 108, so that an etching process can be performed to the exposed portion of the anti-reflection layer 108 and the underlying portion of the dielectric structure 106 to form a trench opening in a subsequent process. In some embodiments, the mask layer 114 may be a hard mask, such as silicon nitride ($Si_3N_4$), which has relatively high etching resistivity compared to the anti-reflection layer 108 and the dielectric structure 106. Formation of the hard mask may be performed by, such as, a CVD process. In some other embodiments, the mask layer 114 may be a photoresist layer. Formation of the mask layer 114 includes forming a photoresist layer on the anti-reflection layer 108 and then patterned to form a photoresist mask with the image of the opening 116.

Figure 4:
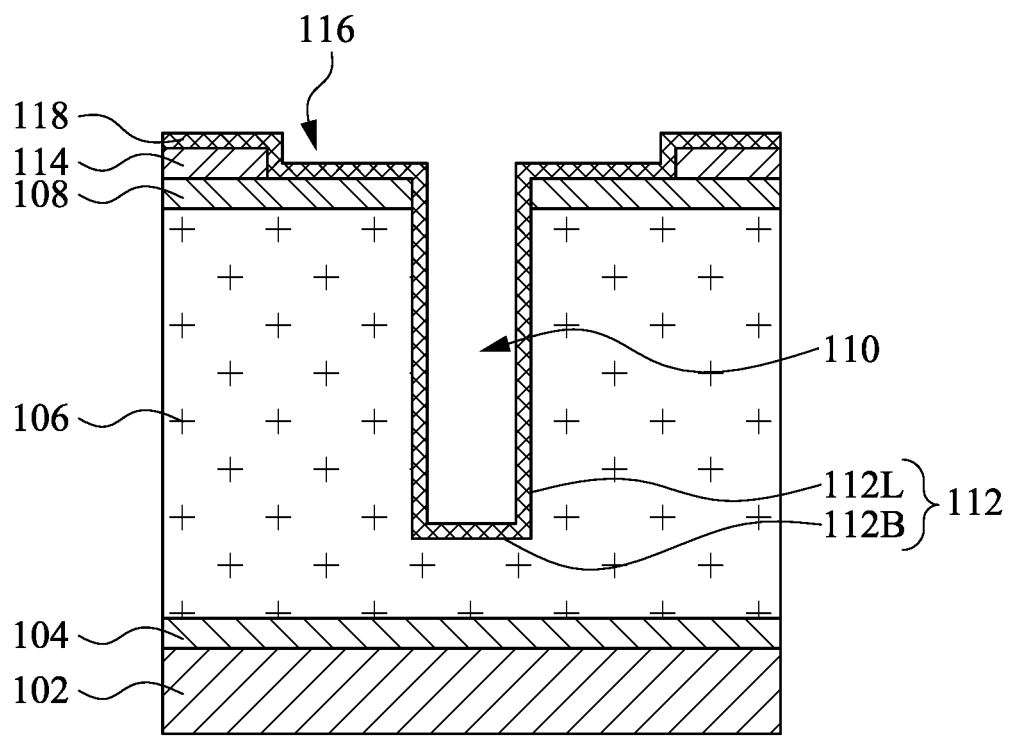

Reference is made to FIG. 4. An anti-adhesion layer 118 is at least formed on the inner surface 112 of the recess 110. In a greater detail, the anti-adhesion layer 118 can be conformally formed on top and lateral surfaces of the mask layer 114, top and lateral surfaces of the anti-reflection layer 108, and the inner surface 112 of the recess 110. In particular, the inner surface 112 of the recess 110 includes a bottom surface 112B and a lateral surface 112L. The lateral surface 112L connects the bottom surface 112B and a top surface of the dielectric structure 106. In some embodiments, the entire lateral surface 112L and the entire bottom surface 112B are covered by the anti-adhesion layer 118. The anti-adhesion layer 118 and the dielectric structure 106 are made of different materials having different adhesion properties. More particularly, the anti-adhesion layer 118 and the dielectric structure 106 have different adhesion abilities to a byproduct of etching the liner layer 104. In detail, the anti-adhesion layer 118 and the dielectric structure 106 include different materials such that the adhesion ability of the anti-adhesion layer 118 to the byproduct of etching the liner layer 104 is weaker than the adhesion ability of the dielectric structure 106 to the byproduct of etching the liner layer 104. Therefore, the anti-adhesion layer 118 formed on the entire inner surface 112 of the recess 110 can prevent the byproduct adhered to the inner surface 112 when etching the liner layer 104 in a subsequent process, so that a size of a subsequently formed via opening is not reduced by the byproduct adhered to the inner surface 112. "Adhesion ability to the byproduct" in this context refers to the amount of the byproduct that can be adhered to per unit area of a surface. More particularly, "the adhesion ability of the anti-adhesion layer 118 to the byproduct" refers to the amount of the byproduct that can be adhered to per unit area of a surface of the anti-adhesion layer 118. Similarly, "the adhesion ability of the dielectric structure 106 to the byproduct" refers to the amount of the byproduct that can be adhered to per unit area of a surface of the dielectric structure 106. In some embodiments, a material of the anti-adhesion layer 118 is dielectric, such as silicon nitride (SiN) or silicon oxynitride (SiON), and a material of the dielectric structure 106 is different from the material of the anti-adhesion layer 118. For example, the dielectric structure 106 includes tetraethoxysilane (TEOS), an extreme low-k (ELK) dielectric material, or nitrogen-free anti-reflective coating (NFARC). By such difference of materials of the anti-adhesion layer 118 and the dielectric structure 106, the anti-adhesion layer 118 can exhibit weaker adhesion ability than the dielectric structure 106. In some embodiments, the anti-adhesion layer 118 is conformally formed on the inner surface 112 of the recess 110. Formation of the anti-adhesion layer 118 may be performed by an atomic layer deposition (ALD) process, or a CVD process. For example, the anti-adhesion layer 118 may be a silicon nitride layer formed by ALD. The silicon nitride layer is formed by the ALD process including multiple silicon nitride deposition cycles, each silicon nitride deposition cycle may include contacting the surfaces of the mask layer 114, the anti-reflection layer 108 and the inner surface 112 of the recess 110 with a silicon precursor, such that the silicon precursor adsorbs on these surfaces, and contacting these surfaces with a nitrogen precursor. The silicon nitride deposition cycle may be repeated as many times as to achieve a desired thickness and composition of a silicon nitride layer. This resulting silicon nitride layer may serve as the anti-adhesion layer 118 conformally formed on the inner surface 112 of the recess 110.

Figure 5:
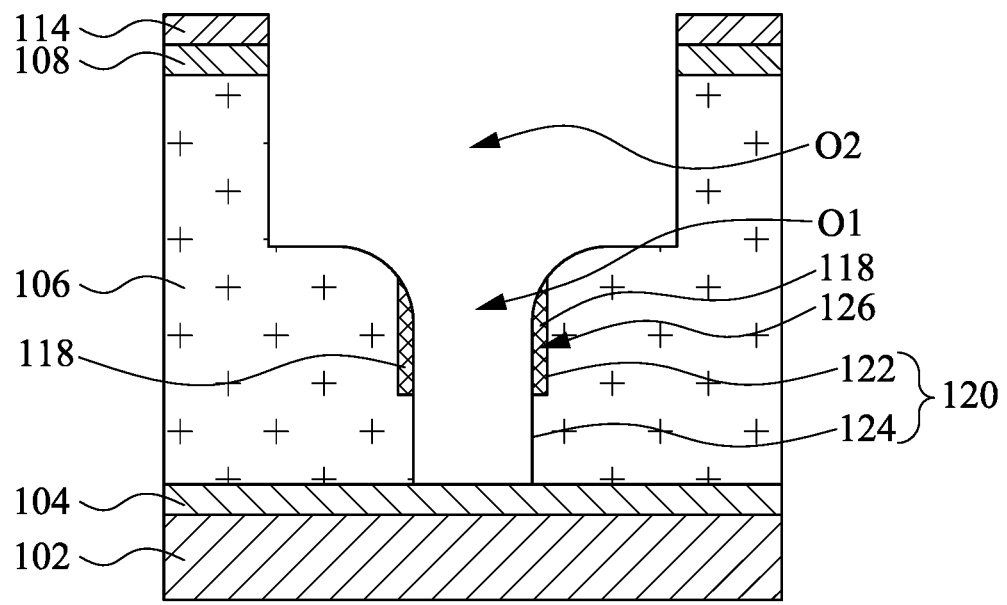

Reference is made to FIG. 5. Portions of the anti-adhesion layer 118, the anti-reflection layer 108, and the dielectric structure 106 are removed, so as to form a via opening O1 and a trench opening O2 in the dielectric structure 106, in which the via opening O1 is present between the trench opening O2 and the liner layer 104, and the via and trench openings O1 and O2 are communicated. In a greater detail, the portion of the dielectric structure 106 underlying the recess 110 in FIG. 4 is removed to form the via opening O1 that exposes the liner layer 104. In other words, the via opening O1 is deepened until reaching the liner layer 104 after forming the anti-adhesion layer 118. Moreover, removing of this portion of the dielectric structure 106 is accompanied by formation of the trench opening O2. In other words, during the period of removing the portion of the dielectric structure 106 underlying the recess 110, another portion of the dielectric structure 106 underlying the opening 116 of the mask layer 114 is removed as well. As such, the via opening O1 and the trench opening O2 can be accomplished in the same process. During the removal process, the mask layer 114 prevents an underlying portion of the dielectric structure 106 from being removed. In other words, formation of the trench opening O2 is removing the portion of the dielectric structure 106 not covered by the mask layer 114. The removal process can be an etching process, such as, an anisotropic etching process. The anisotropic etching process can be, for example, a $CF_4$ based or $C_4F_8$ based dry etching process.

This removal process performed in FIG. 5 forms a sidewall 120 of the via opening O1 underlying the trench opening O2. After formation of the via and trench openings O1 and O2, a portion of the anti-adhesion layer 118 remains on at least a portion of the sidewall 120 and serves as a dielectric via liner, so as to prevent the byproduct from adhered to the sidewall 120 during etching the liner layer 104 in a subsequent process. As such, the size of the via opening O1 is not reduced by the byproduct of etching the liner layer 104.

In some embodiments, since the etching process of exposing the liner layer 104 is performed after formation of the anti-adhesion layer 118, a lower region of the via opening O1 is formed after formation of the anti-adhesion layer 118. Thus, the anti-adhesion layer 118 is absent from the lower region of the via opening O1. Stated differently, the anti-adhesion layer 118 is present on a portion of the sidewall 120. In a greater detail, the sidewall 120 includes an upper portion 122 and a lower portion 124. The lower portion 124 is present between the upper portion 122 and the non-insulator structure 102. In other words, the upper portion 122 is present between the lower portion 124 and the trench opening O2. The anti-adhesion layer 118 is present on the upper portion 122 and not on the lower portion 124. In other words, the upper portion 122 is covered by the anti-adhesion layer 118, and the lower portion 124 is not covered by the anti-adhesion layer 118. In other words, the anti-adhesion layer 118 is present on a portion of the sidewall 120 that is proximal or closest to the trench opening O2. In a greater detail, after formation of the via opening O1, a lowest portion of the lateral surface 112L of the recess 110 in FIG. 4 remains in the dielectric structure 106 and serves as the upper portion 122 of the sidewall 120, and a portion of the anti-adhesion layer 118 on the lowest portion of the lateral surface 112L of the recess 110 in FIG. 4 remains in the dielectric structure 106 as well. In some embodiments, since the anti-adhesion layer 118 is conformally formed on the lateral surface 112L by using, such as, the ALD process, the anti-adhesion layer 118 is conformal to the upper portion 122 of the sidewall 120.

In some embodiments, as shown in FIG. 5, the upper portion 122 and the lower portion 124 of the sidewall 120 are not aligned with each other because the anti-adhesion layer 118 on the upper portion 122 serves as a mask protecting the underlying dielectric structure 106 during the etching process performed in FIG. 5. In a greater detail, a distance from the upper portion 122 to a central axis of the via opening O1 is greater than a distance from the lower portion 124 to a central axis of the via opening O1. Stated differently, the sidewall 120 has a recess 126 thereon. The recess 126 is proximal to the trench opening O2. The anti-adhesion layer 118 is present in the recess 126, or more particularly, the anti-adhesion layer 118 fills the recess 126.

Figure 6:
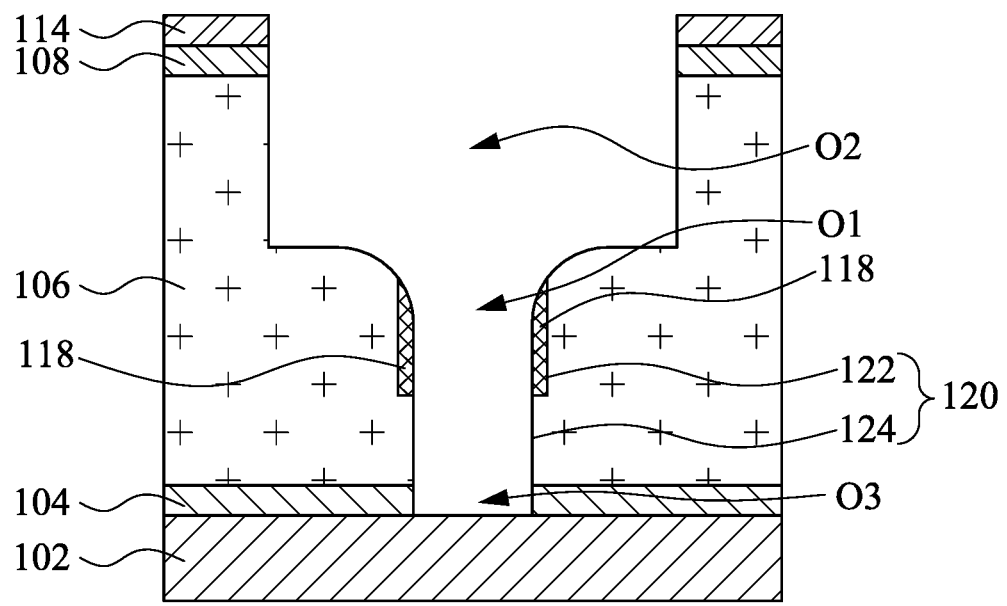

Reference is made to FIG. 6. A portion of the liner layer 104 underlying the via opening O1 is removed to form an opening O3, which allows non-insulator structure 102 exposed by the via opening O1. In a greater detail, the opening O3 of the liner layer 104 exposes the non-insulator structure 102. Since the anti-adhesion layer 118 has the adhesion ability to the byproduct of etching the opening O3 of the liner layer 104 weaker than that of the sidewall 120 of the via opening O1 of the dielectric structure 106, the anti-adhesion layer 118 on the sidewall 120 may prevent the byproduct of etching the opening O3 of the liner layer 104 from adhered to the sidewall 120 during this liner removal process, so that the size of the via opening O1 is not reduced after removing the portion of the liner layer 104. In some embodiments, the non-insulator structure 102 includes metal, and the anti-adhesion layer 118 has an adhesion ability to the metal weaker than that of the sidewall 120 of the via opening O1 of the dielectric structure 106, so that the anti-adhesion layer 118 on the sidewall 120 may prevent the byproduct of over-etching the non-insulator 102 from adhered to the sidewall 120.

In some embodiments, the portion of the liner layer 104 underlying the via opening O1 can be removed by using a dry etching process. The dry etching process may have a high selectivity such that the dry etching process may stop at the non-insulator structure 102. Therefore, unwanted etching of the non-insulator structure 102 may be reduced. For example, the dry etching process may be performed under a source power of about 150 to 220 W, and a pressure of about 10 to 45 mTorr, using $CH_2F_2$ and Ar as etching gases. The liner layer 104 may benefit forming a non-insulator structure 102 without a recess caused by the etching processes of forming the via and trench openings O1 and O2, thereby enhancing the device performance. After this liner removal process, another portion of the liner layer 104 outside the via opening O1 remains between the dielectric structure 106 and the non-insulator structure 102. Since the anti-adhesion layer 118 is absent from the lower portion 124 of the sidewall 120, the anti-adhesion layer 118 is not in contact with the remaining liner layer 104. In other words, the anti-adhesion layer 118 is separated from the remaining liner layer 104. More particularly, the anti-adhesion layer 118 and the remaining liner layer 104 are separated by the lower portion 124 of the sidewall 120 of the dielectric structure 106.

Figure 7:
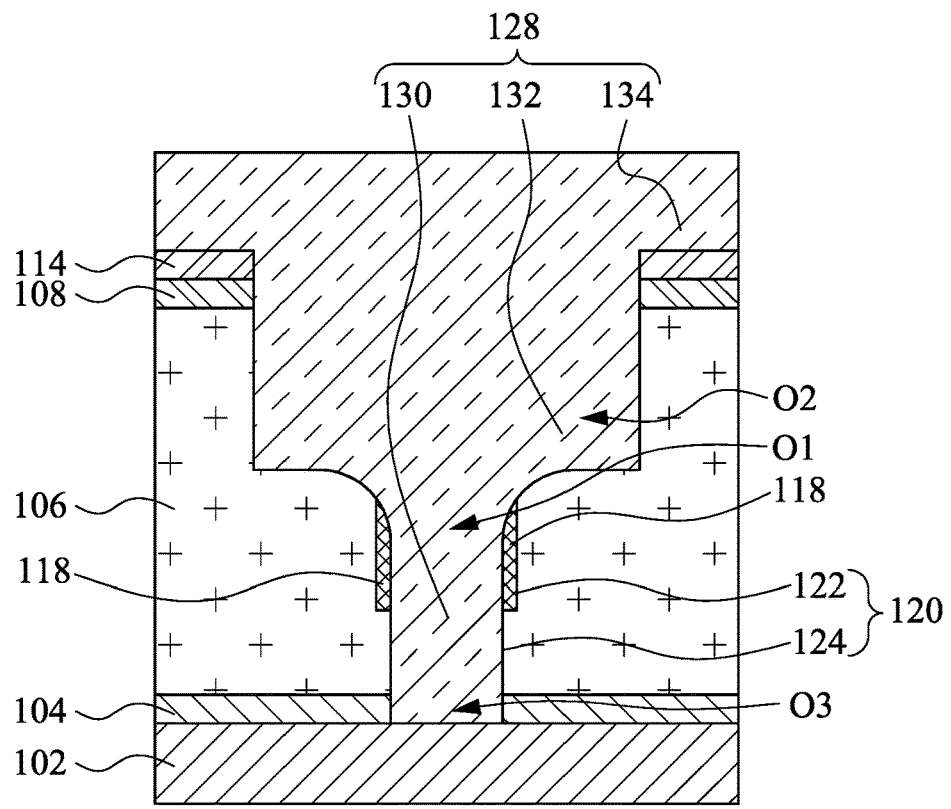

Reference is made to FIG. 7. A conductive structure 128 is formed in the via opening O1 and the trench opening O2 and passes through the opening O3 the liner layer 104 to electrically connect to the non-insulator structure 102. The anti-adhesion layer 118 is present between the upper portion 122 of the sidewall 120 and the conductive structure 128. In a greater detail, the anti-adhesion layer 118 contacts with the upper portion 122 of the sidewall 120 and the conductive structure 128. By such a configuration, the upper portion 122 of the sidewall 120 and the conductive structure 128 are separated by the anti-adhesion layer 118. In other words, the upper portion 122 of the sidewall 120 is not in contact with the conductive structure 128. Since the anti-adhesion layer 118 is absent from the lower portion 124 of the sidewall 120, the lower portion 124 of the sidewall 120 contacts with the conductive structure 128. In other words, the sidewall 120 contacts with the anti-adhesion layer 118 and the conductive structure 128. Stated differently, the conductive structure 128 contacts with the anti-adhesion layer 118 and the sidewall 120. Stated differently, the anti-adhesion layer 118 and the lower portion 124 of the sidewall 120 are respectively present on different regions of the conductive structure 128. In some embodiments, the conductive structure 128 is surrounded by the anti-adhesion layer 118.

In some embodiments, the conductive structure 128 includes TiN, TaN, Ta, Ti, Hf, Zr, Ni, W, Co, Cu, or Al. In some embodiments, the conductive structure 128 may be formed by CVD, PVD, plating, ALD, or other suitable techniques. In some embodiments, the conductive structure 128 may include a laminate. The laminate may further include a barrier metal layer, a linear metal layer or a wetting metal layer. Further, the thickness of the conductive structure 128 depends on the depth of the via and trench openings O1 and O2. The conductive structure 128 is deposited until the via and trench openings O1 and O2 are substantially filled or over-filled.

In some embodiments, when the conductive structure 128 over-fills the trench opening O2, the conductive structure 128 may include a lower conductive portion 130, a middle conductive portion 132 and an upper conductive portion 134. The middle conductive portion 132 connects the lower conductive portion 130 and the upper conductive portion 134. The lower conductive portion 130 fills the via opening O1 and the opening O3 of the liner layer 104 and contacts with the non-insulator structure 102. In a greater detail, the lower conductive portion 130 is present in the via opening O1 and the opening O3 of the liner layer 104 and contacts with the anti-adhesion layer 118 and the lower portion 124 of the sidewall 120. The overfilling portion of the conductive structure 128 forms the upper conductive portion 134 overlying the mask layer 114. The middle conductive portion 132 fills the trench opening O2.

Figure 8:
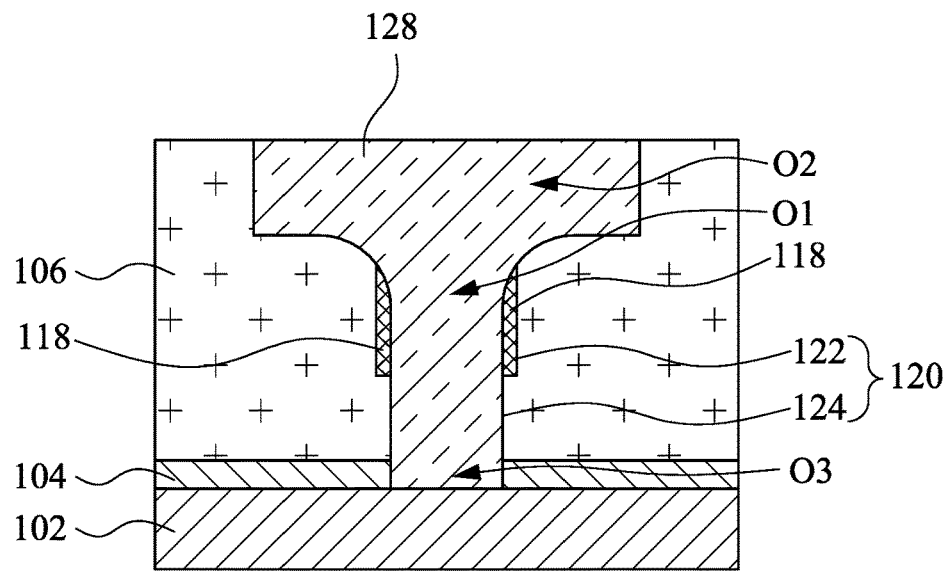

Reference is made to FIG. 8. A chemical-mechanical polishing (CMP) process is performed to planarize the conductive structure 128 after filling the via opening O1 and the trench opening O2. The CMP process removes the upper conductive portion 134 of the conductive structure 128 outside of trench opening O2, the CMP process may stop when reaching the dielectric structure 106, and thus providing a substantially planar surface. The CMP process removes the anti-reflection layer 108 and the mask layer 114.

In some embodiments, since the anti-adhesion layer is present on at least a portion of the sidewall of the via opening during the liner removal process, the anti-adhesion layer can prevent the byproduct of etching the opening of the liner layer from adhered to the sidewall of the via opening during the liner removal process. As a result, the size of the via opening is not reduced by the byproduct, which may benefit enough amount or size of the conductive material to be formed in the via opening.

According to some embodiments of the present disclosure, a device comprises a first metal structure, a dielectric structure, a dielectric residue, and a second metal structure. The dielectric structure is over the first metal structure. The dielectric structure has a stepped sidewall structure. The stepped sidewall structure comprises a lower sidewall and an upper sidewall laterally set back from the lower sidewall. The dielectric residue is embedded in a recessed region in the lower sidewall of the stepped sidewall structure of the dielectric structure. The second metal structure extends through the dielectric structure to the first metal structure.

According to some embodiments of the present disclosure, a device comprises a non-insulator structure, a dielectric structure, a metal structure, and an anti-adhesion material residue. The dielectric structure is over the non-insulator structure. The dielectric structure has a stepped sidewall structure. The stepped sidewall structure comprises a lower sidewall and an upper sidewall laterally set back from the lower sidewall. The metal structure extends through the dielectric structure to the non-insulator structure. The metal structure has an upper metal portion confined by the upper sidewall of the dielectric structure, and a lower metal portion confined by the lower sidewall of the dielectric structure. The anti-adhesion material residue is laterally between the lower metal portion of the metal structure and the dielectric structure. The upper metal portion laterally extending past opposite sides of the anti-adhesion material residue.

According to some embodiments of the present disclosure, a device comprises a first metal structure, a dielectric structure, a second metal structure, and a dielectric residue. The dielectric structure is over the first metal structure. The dielectric structure has a stepped sidewall structure. The stepped sidewall structure comprises a lower sidewall and an upper sidewall laterally set back from the lower sidewall. The second metal structure extends through the dielectric structure. The second metal structure comprises a metal via laterally surrounded by the lower sidewall of the stepped sidewall structure of the dielectric structure, and a metal line laterally surrounded by the upper sidewall of the stepped sidewall structure of the dielectric structure. The dielectric residue is located between the metal via and the lower sidewall of the stepped sidewall structure of the dielectric structure, and absent between the metal line and the upper sidewall of the stepped sidewall structure of the dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first metal structure;
a dielectric structure over the first metal structure, the dielectric structure having a stepped sidewall structure, the stepped sidewall structure comprising a lower sidewall and an upper sidewall laterally set back from the lower sidewall;
a dielectric residue embedded in a recessed region in the lower sidewall of the stepped sidewall structure of the dielectric structure, the dielectric residue having a width decreasing as a distance from the first metal structure increases; and
a second metal structure extending through the dielectric structure to the first metal structure.

2. The device of claim 1, wherein when viewed in a cross section, the dielectric residue extends along a direction substantially perpendicular to a top surface of the first metal structure.

3. The device of claim 1, wherein the dielectric residue has a sidewall substantially aligned with an interface between the lower sidewall of the dielectric structure and the second metal structure.

4. The device of claim 3, wherein an upper portion of the sidewall of the dielectric residue is tapered.

5. The device of claim 1, wherein the dielectric residue has a different material than the dielectric structure.

6. The device of claim 1, wherein the dielectric residue comprises silicon nitride or silicon oxynitride.

7. The device of claim 6, wherein the dielectric structure comprises tetraethoxysilane (TEOS) oxide, an extreme low-k (ELK) dielectric material, or a nitrogen-free anti-reflective coating (NFARC).

8. The device of claim 1, further comprising:
a silicon carbide layer between the first metal structure and the dielectric structure, wherein the second metal structure also extends through the silicon carbide layer.

9. The device of claim 8, wherein the dielectric residue has a bottom end higher than a top surface of the silicon carbide layer by a non-zero distance.

10. A device comprising:
a non-insulator structure;
a dielectric structure over the non-insulator structure, the dielectric structure having a stepped sidewall structure, the stepped sidewall structure comprising a lower sidewall and an upper sidewall laterally set back from the lower sidewall;
a metal structure extending through the dielectric structure to the non-insulator structure, the metal structure having an upper metal portion confined by the upper sidewall of the dielectric structure, and a lower metal portion confined by the lower sidewall of the dielectric structure; and
an anti-adhesion material residue laterally between the lower metal portion of the metal structure and the dielectric structure, the upper metal portion laterally extending past opposite sides of the anti-adhesion material residue, wherein a bottommost position of the anti-adhesion material residue is higher than a bottommost position of the metal structure.

11. The device of claim 10, wherein the anti-adhesion material residue has a tapered top end.

12. The device of claim 10, wherein the metal structure has an inverted rounded corner connecting the lower metal portion and the upper metal portion.

13. The device of claim 12, wherein the anti-adhesion material residue forms a curved interface with the inverted rounded corner of the metal structure.

14. The device of claim 13, wherein the anti-adhesion material residue forms a linear interface with the lower metal portion, and the linear interface extends downwardly from the curved interface and terminates at a position higher than a bottom surface of the lower metal portion.

15. The device of claim 10, wherein the bottommost position of the anti-adhesion material residue is higher than a bottom surface of the dielectric structure.

16. The device of claim 10, wherein the dielectric structure is in contact with the anti-adhesion material residue at the bottommost position of the anti-adhesion material residue.

17. The device of claim 10, wherein the dielectric structure forms an interface with an entire bottom surface of the anti-adhesion material residue.

18. A device comprising:
a first metal structure;
a dielectric structure over the first metal structure, the dielectric structure having a stepped sidewall structure, the stepped sidewall structure comprising a lower sidewall and an upper sidewall laterally set back from the lower sidewall;
a second metal structure extending through the dielectric structure, the second metal structure comprising a metal via laterally surrounded by the lower sidewall of the stepped sidewall structure of the dielectric structure, and a metal line laterally surrounded by the upper sidewall of the stepped sidewall structure of the dielectric structure; and
a dielectric residue located between the metal via and the lower sidewall of the stepped sidewall structure of the dielectric structure, and absent between the metal line and the upper sidewall of the stepped sidewall structure of the dielectric structure, wherein the dielectric structure forms an interface with an entire bottom surface of the dielectric residue at a position higher than a bottom surface of the metal via.

19. The device of claim 18, wherein the dielectric residue is inlaid in the lower sidewall of the stepped sidewall structure of the dielectric structure.

20. The device of claim 18, wherein the dielectric residue has a portion tapering upwardly.

* * * * *